(12) United States Patent
Byun et al.

(10) Patent No.: US 7,595,700 B2
(45) Date of Patent: Sep. 29, 2009

(54) LC QUADRATURE OSCILLATOR HAVING PHASE AND AMPLITUDE MISMATCH COMPENSATOR

(75) Inventors: Sangjin Byun, Daejeon (KR); Chang-Ho Lee, Marietta, GA (US); Haksun Kim, Daejeon (KR); Joy Laskar, Marietta, GA (US)

(73) Assignees: Samsung Electro-Mechanics (KR); Georgia Tech Research Corporation, Atlanta, GA (US)

( * ) Notice: Subject to any disclaimer, the term of this patent is extended or adjusted under 35 U.S.C. 154(b) by 154 days.

(21) Appl. No.: 11/859,523

(22) Filed: Sep. 21, 2007

(65) Prior Publication Data

US 2009/0079509 A1    Mar. 26, 2009

(51) Int. Cl.
*H03B 5/12* (2006.01)

(52) U.S. Cl. .................. 331/117 R; 331/45; 331/47; 331/177 V; 331/183

(58) Field of Classification Search .............. 331/45, 331/47, 49, 56, 117 R, 117 V, 183
See application file for complete search history.

(56) References Cited

U.S. PATENT DOCUMENTS

| 5,635,876 | A   |   | 6/1997  | Gerrits et al. |
|-----------|-----|---|---------|-----------------|
| 5,714,911 | A   | * | 2/1998  | Gilbert ..................... 331/57 |
| 7,075,377 | B2  | * | 7/2006  | Metaxakis ................ 331/46 |
| 7,116,953 | B2  | * | 10/2006 | Kim et al. ................. 455/147 |

FOREIGN PATENT DOCUMENTS

WO    WO 03088497 A1    10/2003

OTHER PUBLICATIONS

Combined Search and Examination Report, Dec. 30, 2008, for GB 0817159.7.

* cited by examiner

*Primary Examiner*—Robert Pascal
*Assistant Examiner*—Levi Gannon
(74) *Attorney, Agent, or Firm*—Sutherland Asbill & Brennan LLP (57) ABSTRACT

Embodiments of the invention may provide for an LC quadrature oscillator that includes two LC oscillators that are cross-coupled with each other to generate I/Q clock signals and a phase and amplitude mismatch compensator. The phase and amplitude mismatch detector may include an amplitude mismatch detector, a transconductor, and a capacitor for compensating for both phase and amplitude mismatches between I/Q clock signals generated in the LC quadrature oscillator.

16 Claims, 6 Drawing Sheets

LC QUADRATURE OSCILLATOR HAVING PHASE AND AMPLITUDE MISMATCH COMPENSATOR

BACKGROUND OF THE INVENTION

1. Field of the Invention

Embodiments of the invention relate generally to an LC quadrature oscillator, and more particularly, to a phase and amplitude mismatch compensator that compensates for phase and amplitude mismatches between I/Q clock signals generated by the LC quadrature oscillator.

2. Description of the Related Art

In general, an LC quadrature oscillator includes two LC oscillators that are cross-coupled with each other to generate I/Q clock signals. During operation of the LC quadrature oscillator, there are LC mismatches (e.g., inductance and/or capacitance mismatches) between the two LC oscillators such the I/Q clock signals generated in the LC quadrature oscillator have phase and amplitude mismatches. These phase and amplitude mismatches between the I/Q clock signals generated in the LC quadrature oscillator can degrade the system performance when the LC quadrature oscillator is used in a clock and data recovery (CDR) circuit or an image reject receiver that requires exact I/Q clock signals for signal processing. For example, the phase and amplitude mismatches between the I/Q clock signals can increase a bit-error rate (BER) of a CDR circuit and reduce an image rejection ratio (IRR) of an image reject receiver. Therefore, there is a need for an accurate phase and amplitude mismatch compensator for an LC quadrature oscillator.

SUMMARY OF THE INVENTION

According to an example embodiment of the invention, there is an LC quadrature oscillator. The LC quadrature oscillator may include a first LC oscillator that generates at least one first clock signal, a second LC oscillator that generates at least one second clock signal, where the at least one first and second clock signals form I/Q clock signals, and a mismatch compensator that compensates for phase and amplitude mismatches of the I/Q clock signals, wherein the mismatch compensator includes an amplitude mismatch detector.

According to another example embodiment of the invention, there is a mismatch compensation method. The method may include generating at least one first clock signal using a first LC oscillator, generating at least one second clock signal using a second LC oscillator, where the at least one first and second clock signals form I/Q clock signals, and compensating for phase and amplitude mismatches of the I/Q clock signals using a mismatch compensator that includes an amplitude mismatch detector.

According to yet another example embodiment of the invention, there is a system. The system may include a first LC oscillator that generates at least one first clock signal, a second LC oscillator that generates at least one second clock signal, where the at least one first and second clock signals form I/Q clock signals, and means for compensating for phase and amplitude mismatches associated with the I/Q clock signals.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Embodiments of the present invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
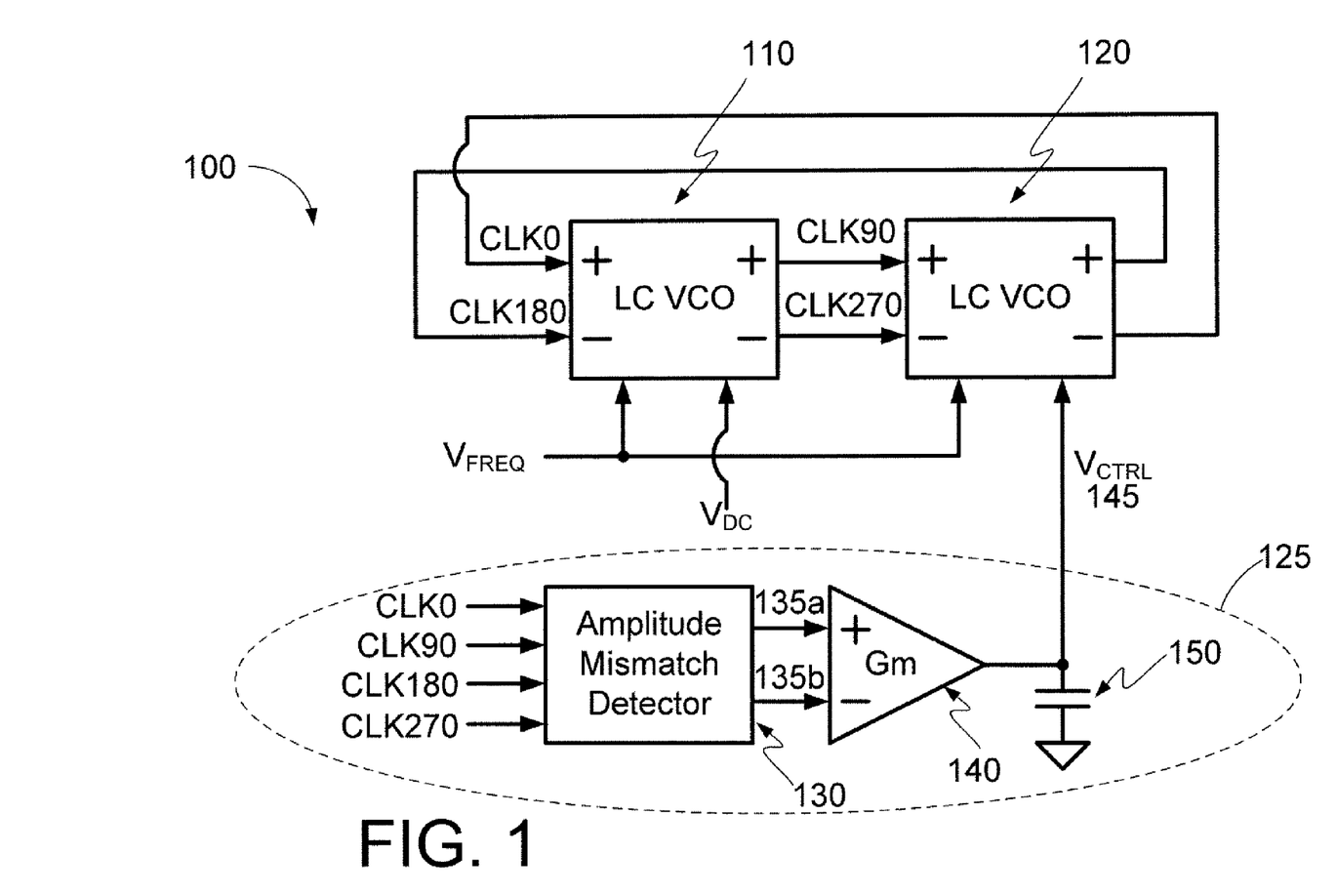
FIG. 1 provides an example block diagram of an LC quadrature oscillator having a phase and amplitude mismatch compensator, according to an example embodiment of the invention.

FIG. 1 is a block diagram illustrating an example LC quadrature oscillator 100, according to an example embodiment of the invention. In particular, the LC quadrature oscillator 100 may include a first LC voltage controlled oscillator (VCO) 110 and a second LC voltage controlled oscillator 120 that are cross-coupled to each other in order to generate clock signals such as I/Q clock signals (e.g., two of CLK0, CLK90, CLK180, CLK270) that are 90 degrees out of phase from each other. According to an example embodiment of the invention, the first LC oscillator 110 may generate the Q clock signals (CLK90, CLK270) while the second LC oscillator 120 may generate the I clock signals (CLK0, CLK180). With respect to the cross-coupling, the Q clock signals (CLK90, CLK270) generated by LC oscillator 110 may be provided as an input to the LC oscillator 120. Likewise, the I clock signals (CLK0, CLK180) generated by the LC oscillator 120 may be provided as an input to the LC oscillator 110. The LC quadrature oscillator 100 may also include a phase and amplitude mismatch compensator 125 that detects and compensates for phase and amplitude mismatches between the I/Q clock signals generated in the two LC oscillators 110, 120.

Still referring to FIG. 1, the phase and amplitude mismatch compensator 125 may be comprised of an amplitude mismatch detector 130, a transconductor 140 in communication with the amplitude mismatch detector 130, and a capacitor 150 in communication with the output of the transconductor 140. The amplitude mismatch detector 130 may be operative to detect amplitudes of the I/Q clock signals generated by the two LC oscillators 110, 120. The amplitude mismatch detector 130 may output the detected amplitudes 135a, 135b of the I/Q clock signals to the transconductor 140. The transconductor 140 may be operative to determine a difference between the detected amplitudes 135a, 135b of the I/Q clock signals and output a current signal representing the determined difference. The capacitor 150 may be operative to convert the current signal received from the transconductor 140 into a voltage signal 145, which may be provided to the second LC oscillator 120 of the two LC oscillators 110, 120. As will be described in further detail below, the voltage signal 145 may be utilized in configuring or adjusting an operation of the LC oscillator 120 so that LC mismatches between the LC oscillators 110, 120 may be compensated for. In an alternative embodiment of the invention, the voltage signal 145 may alternatively or additionally be provided to the first LC oscillator 110 of the two oscillators 110, 120.

It will be also be appreciated that according to an example embodiment of the invention, the phase and amplitude mismatch compensator 125 may utilize an amplitude mismatch detector 130, but no phase mismatch detector associated with phase detections, for use in detecting and compensating for phase and amplitude mismatch of the I/Q clock signals generated by the LC quadrature oscillators 110, 120. According to an example embodiment of the invention, the phase and amplitude mismatch compensator 125 may have an accurate phase resolution because the amplitude mismatch detector 130 may not need a much higher bandwidth than the oscillation frequency of I/Q clock signals to detect an amplitude mismatch. Simplified equations (1) and (2) below illustrate phase and amplitude mismatches versus LC mismatches between two LC oscillators which are cross-coupled with each other.

$$\sin\theta = \frac{RC}{\alpha^2}\Delta\omega \qquad \text{Eq. (1)}$$

$$\Delta V = \frac{2RC}{\alpha}\Delta\omega(1-\gamma) \qquad \text{Eq. (2)}$$

In equations (1) and (2), $\Delta V$ is amplitude mismatch of the I/Q clock signals, $\theta$ is phase mismatch of the I/Q clock signals, R is resistance of an LC tank of an LC oscillator 110, 120, $\alpha$ is the ratio of coupling transconductance versus negative transconductance in the LC quadrature oscillator 100, $\Delta\omega$ is the difference between self oscillation frequencies of two LC oscillators 110, 120 which are cross-coupled with each other, and parameter $\gamma$ indicates if the LC quadrature oscillator 100 is operating in a current-limited regime or voltage-limited regime. A parameter $\gamma$ of 1 indicates that the LC quadrature oscillator 100 is operating in a voltage-limited regime while a parameter $\gamma$ of 0 indicates that the LC quadrature oscillator 100 operates in current-limited regime. Consequently, the parameter $\gamma$ is a value between 0 and 1. According to an embodiment of the invention, the phase and amplitude mismatch compensator 125 may operate most effectively when the parameter $\gamma$ is 0—that is, when the LC quadrature oscillator 100 is operating in a current-limited regime.

As shown in equations (1) and (2), the amplitude mismatch $\Delta V$ and the phase mismatch $\theta$ have an approximately linear relationship with each other. According to an example embodiment of the invention, based upon this approximately linear relationship, the LC quadrature oscillator 100 may utilize an amplitude mismatch detector 130 with no a phase mismatch detector to detect both phase and amplitude mismatches of the I/Q clock signals of the two LC oscillators 110, 120. Indeed, based upon this approximately linear relationship, a correction of amplitude errors based upon the amplitude mismatch detector 130 may likewise correct for phase errors as well, according to an example embodiment of the invention.

Figure 2A:
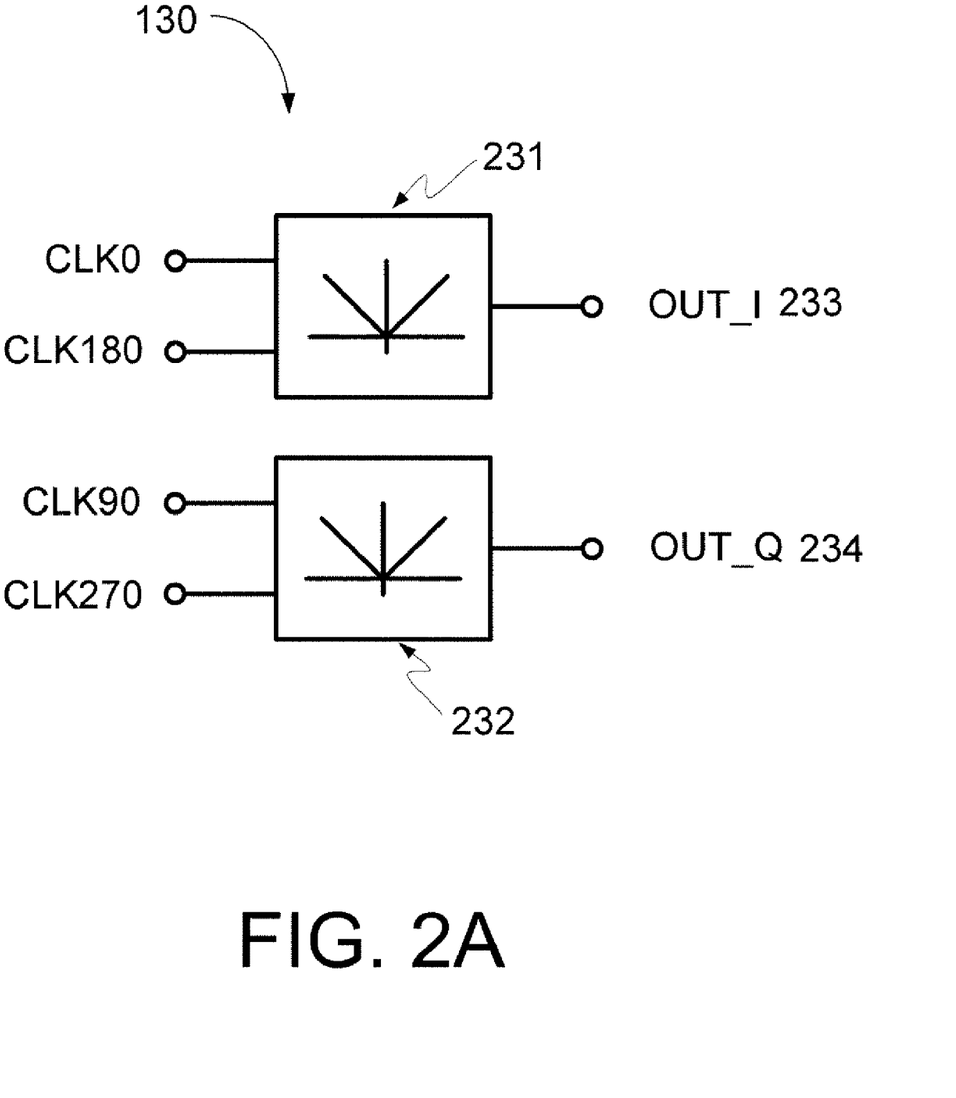
FIG. 2A provides an example block diagram of an illustrative amplitude mismatch detector, according to an example embodiment of the invention.

FIG. 2A illustrates a block diagram of an amplitude mismatch detector 130 according to the present invention. The amplitude mismatch detector 130 may include a first rectifier 231 and a second rectifier 232. The first rectifier 231 may receive the I-clock signals CLK0 and CLK180, and determine the resulting I-clock amplitude signal OUT_I 233. Likewise, the second rectifier 232 may receive the Q-clock signals CLK90 and CLK270, and determine the resulting Q-clock amplitude signal OUT_Q 234.

Figure 2B:
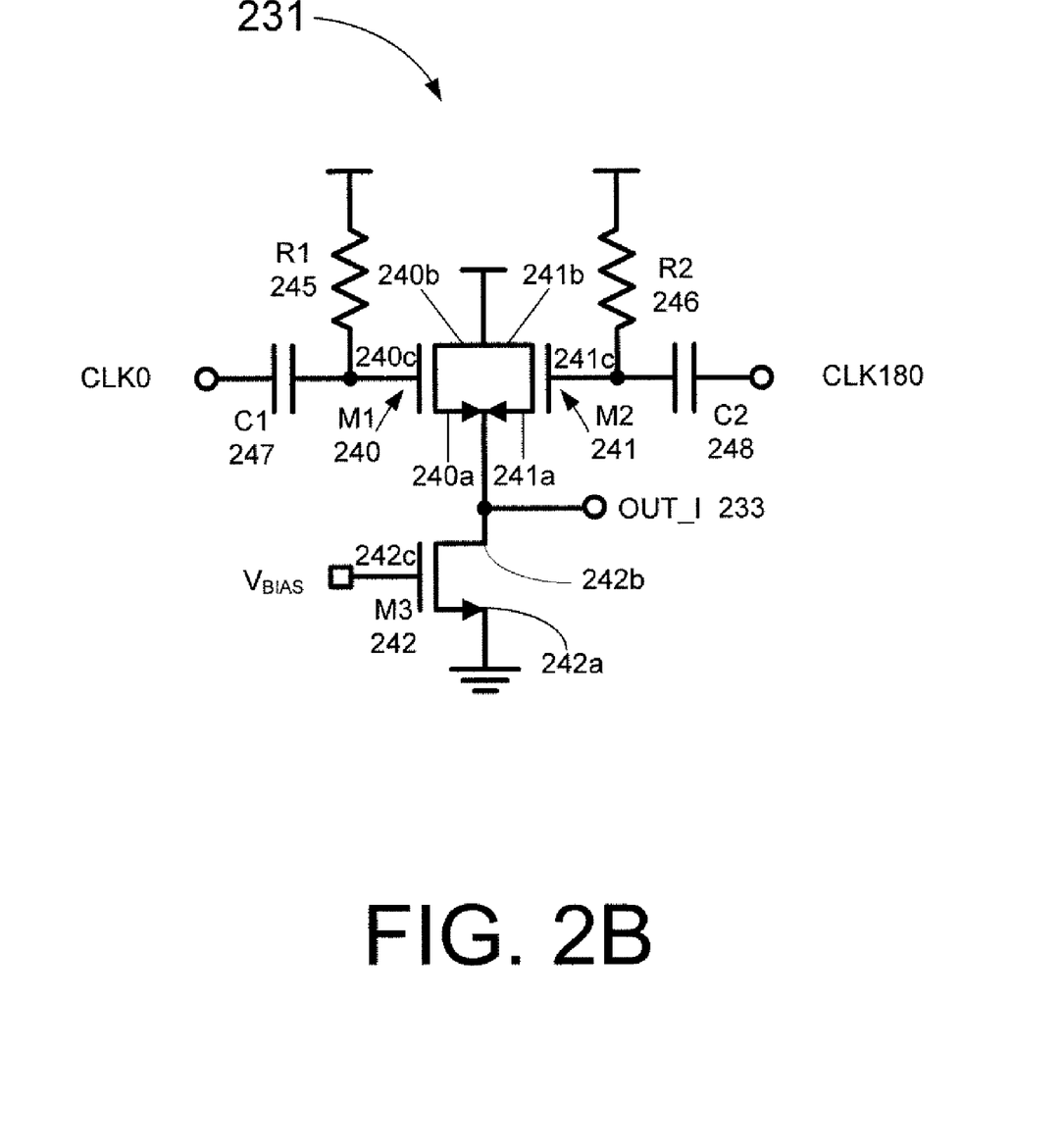
FIG. 2B provides an example circuit diagram of an illustrative rectifier, according to an example embodiment of the invention.

FIG. 2B illustrates an example circuit diagram of a rectifier 231 according to an example embodiment of the invention. The rectifier 231 may include transistors M1 240, M2 241, and M3 242. The transistor M1 240 may include a source 240a, a drain 240b, and a gate 240c. The transistor M2 241 may include a source 241a, a drain 241b, and a gate 241c. The transistor M3 243 may include a source 243a, a drain 243b, and a gate 243c. As shown in FIG. 2B, the source 240a of transistor M1 240 may be connected to the source 241a of transistor M2 241. Likewise, the drain 240b of transistor M1 240 may be connected to the drain 241b of transistor M2 241. Additionally, the drain 242b of transistor M3 242 may be connected to the sources 240a, 241a of respective transistors M1 240 and M2 241. The output port OUT_I 233 of the rectifier 231 may be provided between the drain 242b of transistor M3 242 and the sources 240a, 241a of respective transistors M1 240 and M2 241, according to an example embodiment of the invention.

Still referring to FIG. 2B, the rectifier 231 may also include a resistor R1 245 and a capacitor C1 247 that is connected to the gate 240c of transistor M1 240. Likewise, a resistor R2 246 and a capacitor C2 248 may be connected to the gate 241c of transistor M2 241. According to an embodiment of the invention, the capacitors C1 247, C2 248 may perform DC blocking while the resistors R1 245, E2 246 may provide DC bias to the respective transistors M1 240, M2 241. It will be appreciated that while FIG. 2B illustrates an example block diagram of rectifier 231, the block diagram is also applicable to rectifier 232 as well. For example, the block diagram of FIG. 2B may be alternately illustrated as accepting clock signals CLK90 and CLK270 instead of clock signals CLK0 and CLK 180. Indeed, other variations to the block diagram of FIG. 28 are available without departing from example embodiments of rectifiers.

Figure 3:
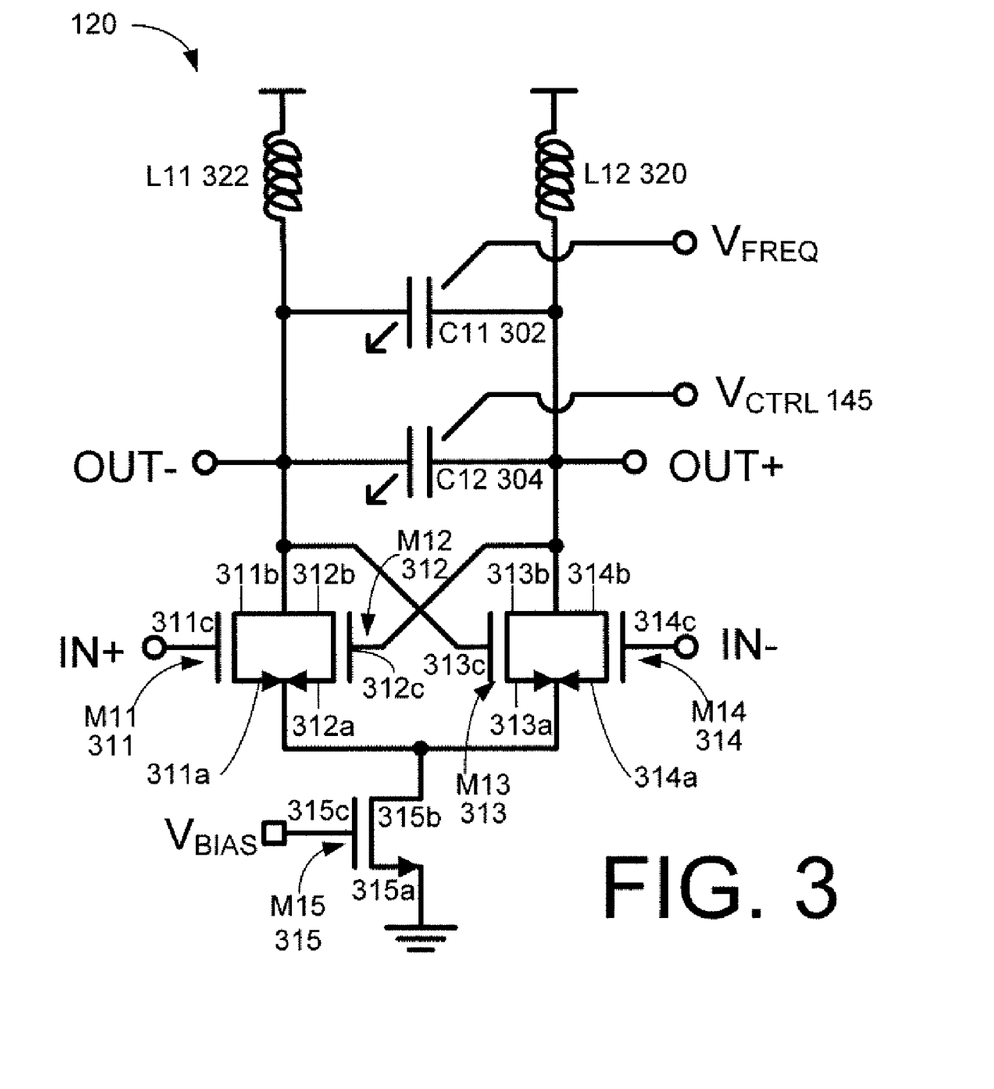
FIG. 3 provides an example circuit diagram of an illustrative LC oscillator, according to an example embodiment of the invention.

FIG. 3 is an example circuit diagram of an illustrative an LC oscillator 120, according to an embodiment of the invention. The LC oscillator 120 may include a plurality of variable capacitors, including a main varactor C11 302 and a compensating varactor C12 304. The capacitance of main varactor C11 302 may be configured according to frequency voltage $V_{FREQ}$. Likewise, the capacitance of compensating varactor C12 304 may be configured according to control voltage $V_{CTRL}$ received from the a phase and amplitude mismatch compensator 125. The main varactor C11 302 may be operative in controlling the oscillating frequency of each LC oscillator 110, 120. The compensating varactor C12 304 may be operative to compensate for LC mismatches between two LC oscillators 110, 120 that are cross-coupled with each other. According to an example embodiment of the invention, the size of the compensating varactor C12 304 may be adjusted or configured to be relatively smaller than the size of the main varactor C11 302 but also large enough to cover the range of LC mismatches to be compensated. For an example, if LC mismatches are to be compensated 1%, the size of the compensating varactor C 12 may be designed to be 1% of the total size of the main varactor C11 302 and the compensating varactor C12.

Still referring to FIG. 3, the LC oscillator 120 may also include transistors M11 311, M12 312, M13 313, M14 314, and M15 315. Transistor M11 311 may include a source 311a, a drain 311b, and a gate 311c. Transistor M12 312 may include a source 312a, a drain 312b, and a gate 312c. Transistor M13 313 may include a source 313a, a drain 313b, and a gate 313c. Likewise, transistor M14 314 may include a source 314a, a drain 314b, and a gate 314c. Similarly, transistor M15 315 may include a source 315a, a drain 315b, and a gate 315c.

In FIG. 3, the source 311a of transistor M11 311 may be connected to the source 312a of transistor M12 312. The drain 311b of transistor M11 311 may also be connected to the drain 312b of transistor M12 312. Likewise, the source 313a of transistor M13 313 may be connected to the source 314a of transistor M14 314. The drain 314b of transistor M14 314 may also be connected to the drain 314b of transistor M14 314. Additionally, a drain 315b of transistor M15 315 may be connected to the sources 311a, 312a, 313a, and 314a of respective transistors M11 311, M12 312, M13 313, and M14 314.

As shown in FIG. 3, a first input port IN+ (e.g., CLK90) may be provided at the gate 311c of transistor M11 311 while a second input port IN− (e.g., CLK270) may be provided at the gate 314c of transistor 314. In addition, a first output port OUT− (e.g., CLK0) shared by the varactors C11 302, C12 304 may be connected to an inductor L11 322, drains 311b, 312b, and gate 313c. A second output port OUT+ (e.g., CLK180) shared by the varactors C11 302, C12 304 may be connected to an inductor L12 320, drains 313b, 314b, and gate 312c.

It will be appreciated that while FIG. 3 illustrates an example block diagram of an illustrative LC oscillator 120, the block diagram is also applicable to the LC oscillator 110 as well. It will be appreciated that variations of the block diagram of FIG. 3 are available without departing from example embodiments of the invention.

Figure 4:
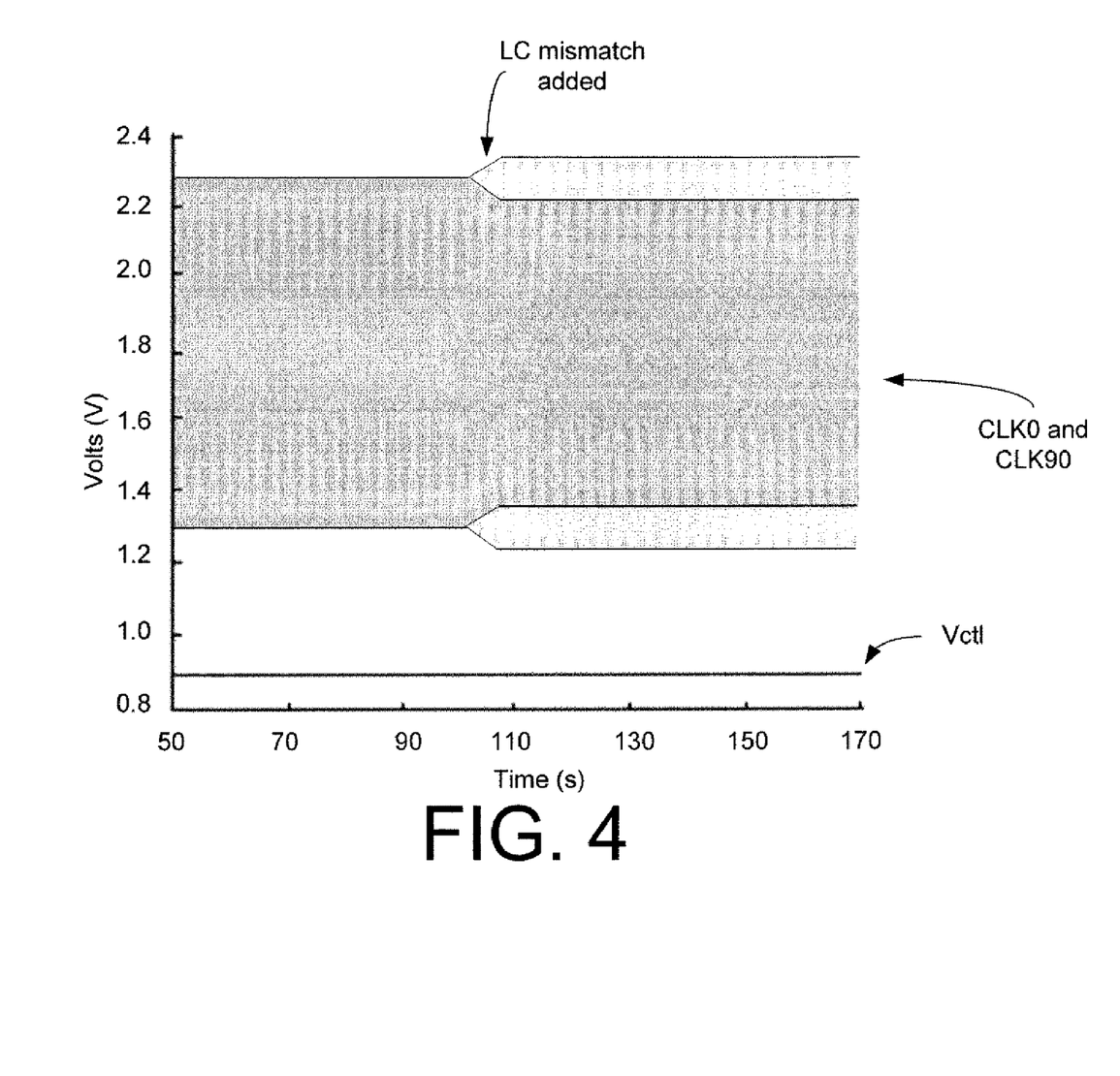
FIG. 4 provides simulated waveforms of an LC quadrature oscillator in which a phase and amplitude mismatch compensator is not utilized, according to an example embodiment of the invention.
Figure 5:
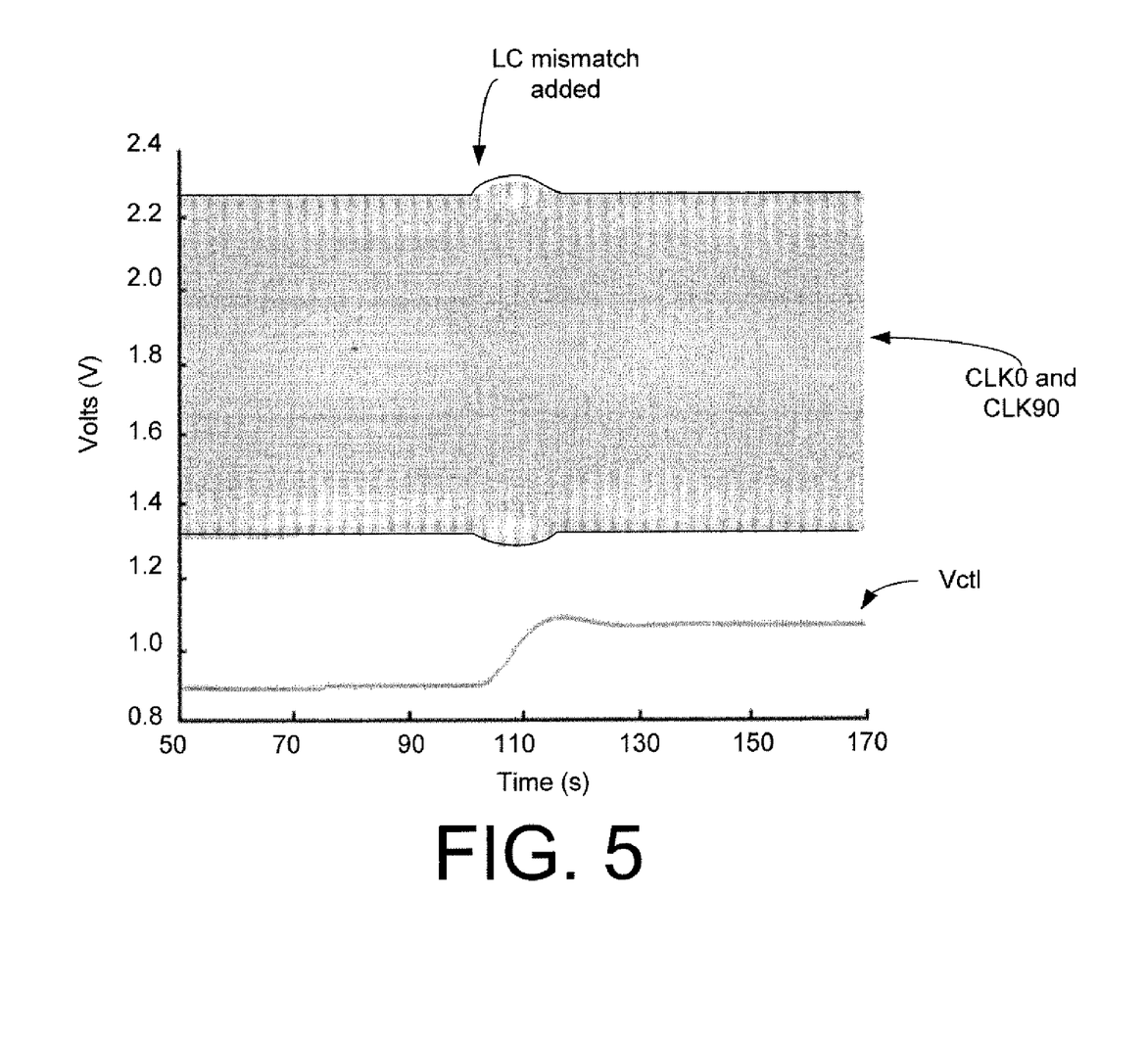
FIG. 5 provides simulated waveforms of an LC quadrature oscillator in which a phase and amplitude mismatch compensator is utilized, according to an example embodiment of the invention.

FIG. 4 illustrates simulated waveforms for I/Q clock signals CLK0, CLK90 and a control voltage $V_{CTRL}$ signal 145 for configuring or adjusting an operation of the LC oscillator 120 in an LC quadrature oscillator 100 when a phase and amplitude mismatch compensator 125 is not utilized, according to an example embodiment of the invention. As shown in a FIG. 4, when an LC mismatch is added and the phase and amplitude mismatch compensator 125 is not utilized, the amplitude and phase mismatches in the I/Q clock signals are present due to LC mismatches in between the LC oscillators 110, 120. By contrast, FIG. 5 illustrates simulated waveforms for I/Q clock signals CLK0, CLK90 and control voltage $V_{CTRL}$ signal 145 in an LC quadrature oscillator 100 when the phase and amplitude mismatch compensator 125 is utilized, according to an example embodiment of the invention. As shown in FIG. 5, when the LC mismatch is added and the phase and amplitude mismatch compensator 125 is utilized, the amplitude and phase mismatches in the I/Q clock signals are substantially eliminated. Accordingly, in FIG. 5, the phase and amplitude mismatch compensator 125 is operative to remove LC mismatches between the two LC oscillators 110, 120.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An LC quadrature oscillator, comprising:
   a first LC oscillator that generates at least one first clock signal;
   a second LC oscillator that generates at least one second clock signal, wherein the at least one first and second clock signals form I/Q clock signals; and
   a mismatch compensator that compensates for phase and amplitude mismatches of the I/Q clock signals, wherein the mismatch compensator includes:
   an amplitude mismatch detector that detects a first amplitude associated with the at least one first clock signal and a second amplitude associated with the at least one second clock signal,
   a transconductor that receives the detected first and second amplitudes and generates a current signal that represents a difference between the first and second amplitudes, and
   a capacitor that converts the current signal received from the transconductor into a voltage signal, wherein the voltage signal is provided to configure an operation of the second LC oscillator.

2. The LC quadrature oscillator of claim 1, wherein the first oscillator and the second oscillator are cross-coupled to each other.

3. The LC quadrature oscillator of claim 2, wherein the first oscillator and the second oscillator are cross-coupled to each other by providing the first clock signal as a first input to the second oscillator and by providing the second clock signal as a second input to the first oscillator.

4. The LC quadrature oscillator of claim 1, wherein the amplitude mismatch detector includes at least one rectifier.

5. The LC quadrature oscillator of claim 4, wherein the at least one rectifier includes:
   a first transistor having a first source and a first drain;
   a second transistor having a second source and a second drain, wherein the first source and the second source are electrically connected and the first drain and the second drain are electrically connected; and
   a third transistor having a third source and a third drain, wherein the third drain is electrically connected to the first source and the second source.

6. The LC quadrature oscillator of claim 5, wherein the first transistor further includes a first gate, wherein the second transistor further includes a second gate, and wherein the at least one rectifier includes:
   a first resistor and a first capacitor electrically connected to the first gate; and
   a second resistor and a second capacitor electrically connected to the second gate.

7. The LC quadrature oscillator of claim 1, wherein the second LC oscillator includes:
   a first varactor for controlling an oscillating frequency of the second LC oscillator;
   a second varactor for compensating one or both of inductance (L) and capacitance (C) mismatches between the first LC oscillator and the second LC oscillator.

8. The LC quadrature oscillator of claim 7, wherein the second varactor is configured based upon the voltage signal generated by the mismatch compensator.

9. A mismatch compensation method, comprising:
   generating at least one first clock signal using a first LC oscillator;

generating at least one second clock signal using a second LC oscillator, wherein the at least one first and second clock signals form I/Q clock signals; and compensating for phase and amplitude mismatches of the I/Q clock signals using a mismatch compensator that includes an amplitude mismatch detector, wherein compensating for phase and amplitude mismatches includes:

the amplitude mismatch detector detecting a first amplitude associated with the at least one first clock signal and a second amplitude associated with the at least one second clock signal, receiving the detected first and second amplitudes by a transconductor, generating, by the transconductor, a current signal that represents a difference between the detected first and second amplitudes, converting the current signal into a voltage signal, and configuring an operation of the second LC oscillator based upon the voltage signal.

10. The method of claim 9, wherein the at least one first and second clock signals are generated using first and second LC oscillators that are cross-coupled to each other.

11. The method of claim 10, wherein the first oscillator and the second oscillator are cross-coupled to each other by providing the first clock signal as a first input to the second oscillator and by providing the second clock signal as a second input to the first oscillator.

12. The method of claim 9, wherein the amplitude mismatch detector includes at least one rectifier.

13. The method of claim 12, wherein the at least one rectifier includes:

a first transistor having a first source and a first drain;

a second transistor having a second source and a second drain, wherein the first source and the second source are electrically connected and the first drain and the second drain are electrically connected; and a third transistor having a third source and a third drain, wherein the third drain is electrically connected to the first source and the second source.

14. The method of claim 13, wherein the first transistor further includes a first gate, wherein the second transistor further includes a second gate, and wherein the at least one rectifier includes:

a first resistor and a first capacitor electrically connected to the first gate; and a second resistor and a second capacitor electrically connected to the second gate.

15. The method of claim 9, wherein the second LC oscillator includes:

a first varactor for controlling an oscillating frequency of the second LC oscillator;

a second varactor for compensating one or both of inductance (L) and capacitance (C) mismatches between the first LC oscillator and the second LC oscillator.

16. The method of claim 15, wherein compensating for phase and amplitude mismatches includes the mismatch compensator generating the voltage signal that is utilized in configuring the second varactor.

* * * * *